United States Patent
Chiu (10) Patent No.: US 11,961,569 B2
(45) Date of Patent: Apr. 16, 2024

(54) CLOCK-GENERATING CIRCUIT

(71) Applicant: Winbond Electronics Corp., Taichung (TW)

(72) Inventor: Liang-Hsiang Chiu, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 142 days.

(21) Appl. No.: 17/861,992

(22) Filed: Jul. 11, 2022

(65) Prior Publication Data

US 2024/0013841 A1 Jan. 11, 2024

(51) Int. Cl.
*G11C 16/32* (2006.01)
*G06F 1/06* (2006.01)
*G11C 16/26* (2006.01)
*H03K 3/037* (2006.01)

(52) U.S. Cl.
CPC .............. *G11C 16/32* (2013.01); *G06F 1/06* (2013.01); *G11C 16/26* (2013.01); *H03K 3/037* (2013.01)

(58) Field of Classification Search
CPC ....... G11C 16/32; G11C 16/26; G11C 7/1072; G11C 7/22; G11C 7/222; G11C 7/225; G11C 8/18; G11C 29/023; G11C 29/12015; G11C 29/56012; G11C 11/1693; G11C 11/2293; G11C 11/40611; G11C 11/40615; G11C 11/4063; G11C 11/4076; G11C 11/413; G11C 2207/22
See application file for complete search history.

(56) References Cited

U.S. PATENT DOCUMENTS

| | | |
|---|---|---|
| 6,888,763 B1 | 5/2005 | Guo |
| 7,466,115 B2 | 12/2008 | Biagi |
| 7,538,629 B2 | 5/2009 | Nishiyama |
| 7,557,550 B2 | 7/2009 | Mellachurvu et al. |
| 9,461,623 B2 | 10/2016 | Wu et al. |
| 9,484,893 B1 | 11/2016 | Ruotsalainen et al. |

*Primary Examiner* — Alfredo Bermudez Lozada
(74) *Attorney, Agent, or Firm* — Birch, Stewart, Kolasch & Birch, LLP (57) ABSTRACT

A clock-generating circuit is provided, which includes a voltage-reference circuit, a tracking-voltage-generating circuit, a voltage regulator, an oscillation generator, and a level shifter. The voltage-reference circuit and the tracking-voltage-generating circuit respectively convert the external voltage into a reference voltage and a temporary reference voltage. The voltage regulator receives the reference voltage and the temporary reference voltage, and it converts the reference voltage or the temporary reference voltage into an oscillation power-supply voltage. The oscillation generator generates a first clock signal according to the oscillation power-supply voltage. The level shifter converts a voltage amplitude of the first clock signal to generate a second clock signal that is output by the clock-generating circuit. The voltage regulator includes a switch circuit for controlling whether to pull up the oscillation power-supply voltage, which is at an output terminal of the voltage regulator, to the external voltage according to an enable signal.

13 Claims, 9 Drawing Sheets

CLOCK-GENERATING CIRCUIT

BACKGROUND OF THE INVENTION

Field of the Invention

The present invention relates to a clock-generating circuit, and, in particular, to a clock-generating circuit capable of improving the frequency variation of a clock signal.

Description of the Related Art

Today's integrated circuits are used for a wide variety of different applications, and a clock-generating circuit is often required, to provide a basic clock signal to the integrated circuit system. However, the design specifications for NAND flash memory ensure that the data read transfer time (tRD), which is the time required for transferring data from the flash memory cell to the data register, is determined by the operation cycle of the system. Therefore, the accuracy of the data read transfer time (tRD) depends on the accuracy of the clock signal.

BRIEF SUMMARY OF THE INVENTION

An embodiment of the present invention provides a clock-generating circuit, which includes a voltage-reference circuit, a tracking-voltage-generating circuit, a voltage regulator, an oscillation generator, and a level shifter. The voltage-reference circuit and the tracking-voltage-generating circuit respectively convert the external voltage into a reference voltage and a temporary reference voltage. The voltage regulator receives the reference voltage and the temporary reference voltage, and it converts the reference voltage or the temporary reference voltage into an oscillation power-supply voltage. The oscillation generator generates a first clock signal according to the oscillation power-supply voltage. The level shifter converts a voltage amplitude of the first clock signal to generate a second clock signal output by the clock-generating circuit. The voltage regulator includes a switch circuit for controlling whether to pull up the oscillation power-supply voltage, which is at an output terminal of the voltage regulator, to the external voltage according to an enable signal.

BRIEF DESCRIPTION OF THE DRAWINGS

The present invention can be more fully understood by reading the subsequent detailed description and examples with references made to the accompanying drawings, wherein:

FIGS. 2B-1 and 2B-2 are portions of a schematic diagram of the clock-generating circuit in accordance with the embodiment of FIG. 2A;

FIGS. 3B-1 and 3B-2 are portions of a schematic diagram of the clock-generating circuit in accordance with an embodiment of FIG. 3A;

DETAILED DESCRIPTION OF THE INVENTION

Figure 1:
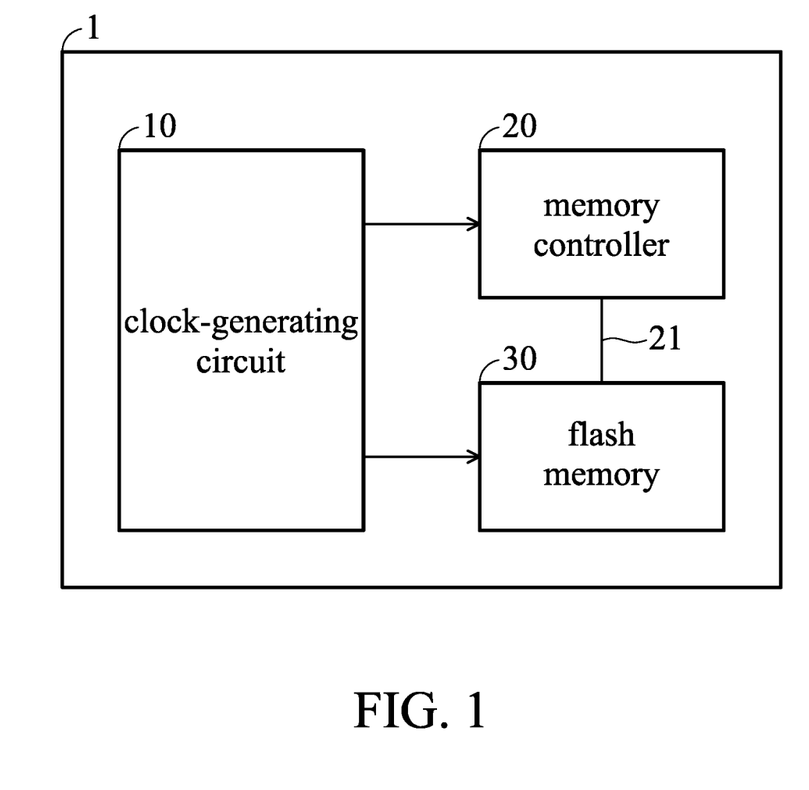
FIG. 1 is a block diagram of an integrated circuit in accordance with an embodiment of the invention.

FIG. 1 is a block diagram of an integrated circuit in accordance with an embodiment of the invention. As shown in FIG. 1, the integrated circuit 1 at least includes a clock-generating circuit 10 and a memory controller 20. The clock-generating circuit 10 may be used for providing an output clock signal to the memory controller 20 and the flash memory 30 (and other digital circuits not shown in the integrated circuit 1) for circuit operation. The flash memory 30, for example, may be disposed in the integrated circuit 1, or disposed outside the integrated circuit 1. The memory controller 20 and the flash memory 30 are coupled to each other through bus 21. The memory controller 20 may be used to control read operations, write operations, and erase operations of the flash memory 30.

Figure 2A:
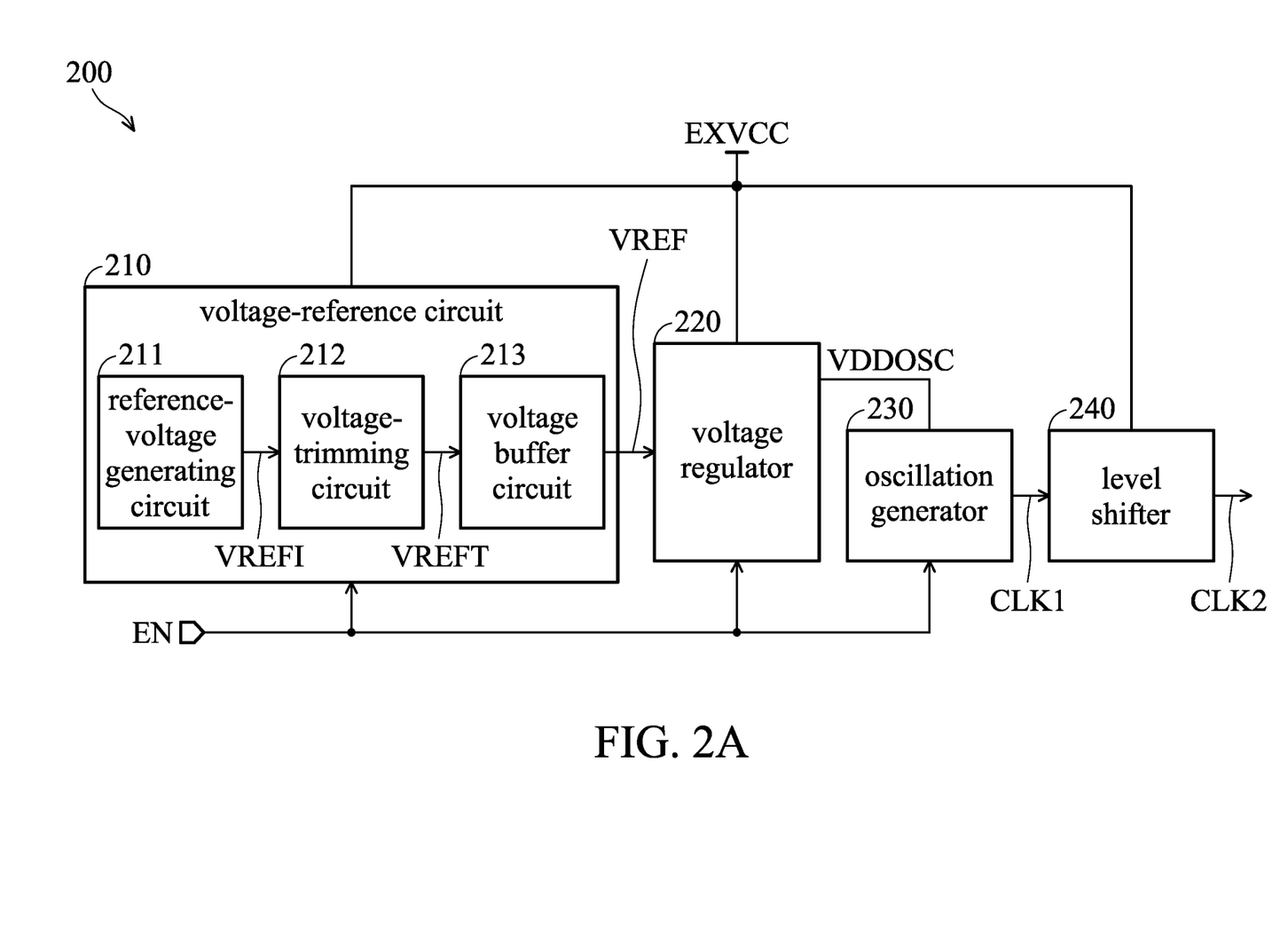
FIG. 2A is a block diagram of the clock-generating circuit in accordance with the embodiment of FIG. 1.
Figure 2B:
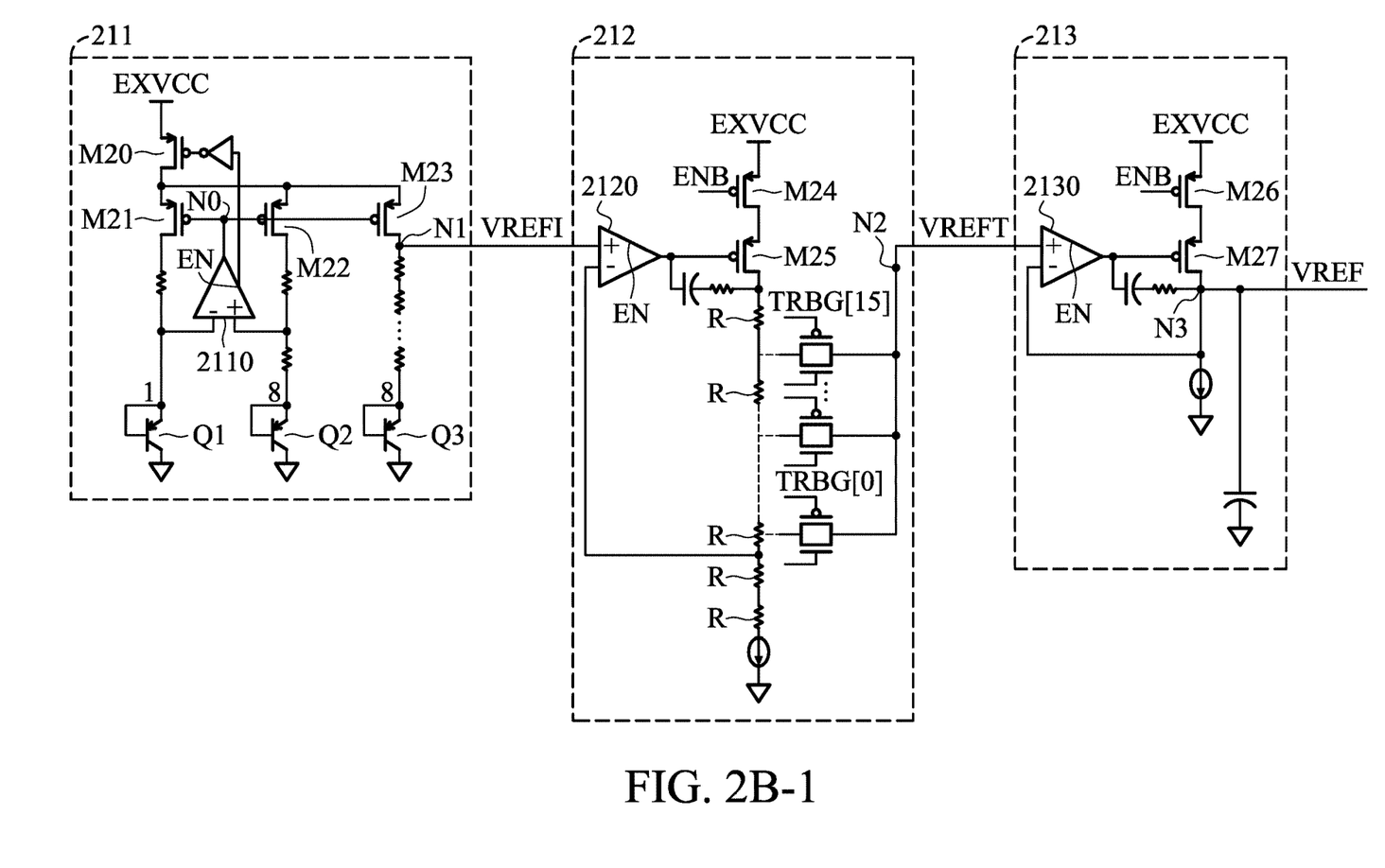
Figure 2B:
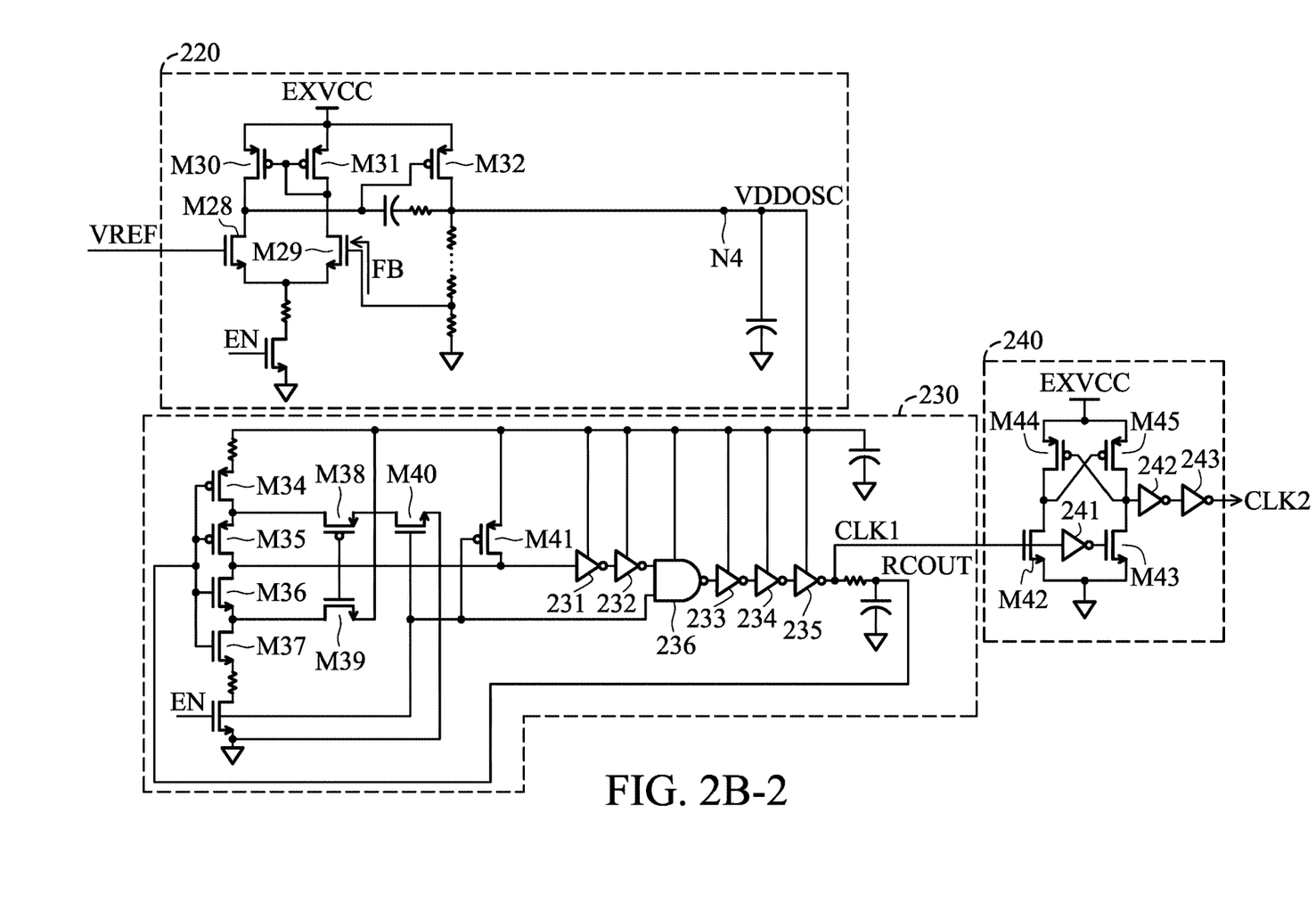

FIG. 2A is a block diagram of the clock-generating circuit in accordance with the embodiment of FIG. 1. FIGS. 2B-1 and 2B-2 are portions of a schematic diagram of the clock-generating circuit in accordance with the embodiment of FIG. 2A. Please refer to FIG. 1, FIG. 2A, and FIGS. 2B-2 and 2B-2.

In an embodiment, the clock-generating circuit 10 in FIG. 1 may be implemented by the clock-generating circuit 200 in FIG. 2A. As shown in FIG. 2A, the clock-generating circuit 200 may include a voltage-reference circuit 210, a voltage regulator 220, an oscillation generator 230, and a level shifter 240, wherein the voltage-reference circuit 210, the voltage regulator 220, and the oscillation generator 230 are controlled by an enable signal EN. When the enable signal EN is in a high-logic state, the voltage-reference circuit 210, the voltage regulator 220, and the oscillation generator 230 are in a working state. When the enable signal EN is in a low-logic state, the voltage-reference circuit 210, the voltage regulator 220, and oscillation generator 230 enter a standby state.

For example, the voltage-reference circuit 210 may generate a reference voltage VREF, and provide the reference voltage VREF to the voltage regulator 220. In some embodiments, the voltage-reference circuit 210 may be implemented by a bandgap voltage reference circuit, and the voltage-reference circuit 210 may include a reference-voltage-generating circuit 211, a voltage-trimming 212, and a voltage buffer circuit 213. The operational amplifier 2110 of the reference-voltage-generating circuit 211 is controlled by the enable signal EN. When the enable signal EN is in the high-logic state, the transistor M20 is turned on. With appropriate circuit design, the output terminal of the operational amplifier 2110 will generate a proper bias voltage at this time, so the voltage VREFI can be generated at node N1.

The voltage-trimming circuit 212, for example, may trim the voltage VREFI through a series of resistors R and a combination of transmission gates of multiple bits. The voltage-trimming circuit 212 can trim the voltage VREFI through the transmission-gate control signal TRBG[15:0], and generate voltage VREFT at node N2 which is provided to the voltage buffer circuit 213. The voltage buffer circuit 213 may buffer the input voltage VREFT and generate the reference voltage VREF at node N3.

The voltage regulator 220 may be used to convert the reference voltage VREF into an oscillation power-supply voltage VDDOSC, and provide the oscillation power-supply voltage VDDOSC to the oscillation generator 230. For example, the voltage regulator 220 may be disposed in the integrated circuit 1 to provide a stable voltage for use by the oscillation generator 230, so as to make the frequency of the clock signal generated by the oscillator generator 230 more stable. For example, two inputs of the differential-pair circuit formed by the transistors M28 and M29 are respectively the reference voltage VREF and a feedback voltage FB, and can generate the oscillation power-supply voltage VDDOSC at its output terminal (e.g., node N4).

The oscillation generator 230 may generate oscillation according to the oscillation power-supply voltage VDDOSC to output a clock signal CLK1. In an embodiment, the oscillation generator 230 may be implemented by a plurality of inverters 231-235 connected in series plus a suitable gate control circuit (e.g., transistors M34-M41 and a NAND gate 236) that are controlled by the enable signal EN, as shown in FIG. 2B-2. It should be noted that the oscillation generator 230 is not limited to the aforementioned implementation, and those having ordinary skill in the art of the present invention can use oscillation generators well known in the art to implement the oscillation generator 230.

The level shifter 240 may be used to convert the clock signal CLK1 (e.g., first clock signal) into the clock signal CLK2 (e.g., second clock signal), and provide the clock signal CLK2 to the backend system, where the voltage amplitude of the clock signal CLK2 may be greater than (or less than) the voltage amplitude of the clock signal CLK1. As shown in FIG. 2B-2, the level shifter 240 can be implemented by transistors M42-M45 and inverters 241-243.

Figure 3A:
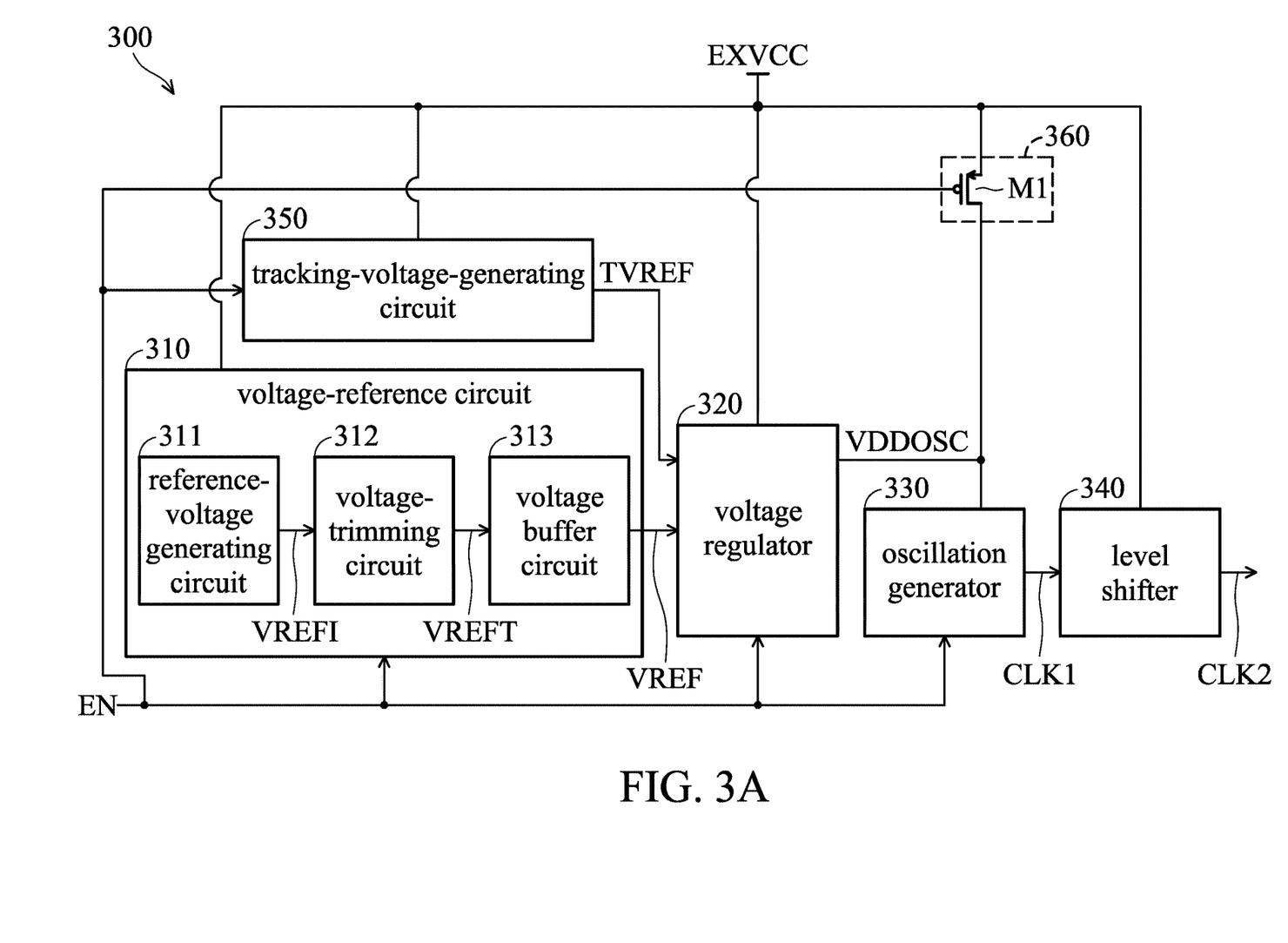
FIG. 3A is a block diagram of the clock-generating circuit in accordance with another embodiment of FIG. 1.
Figure 3B:
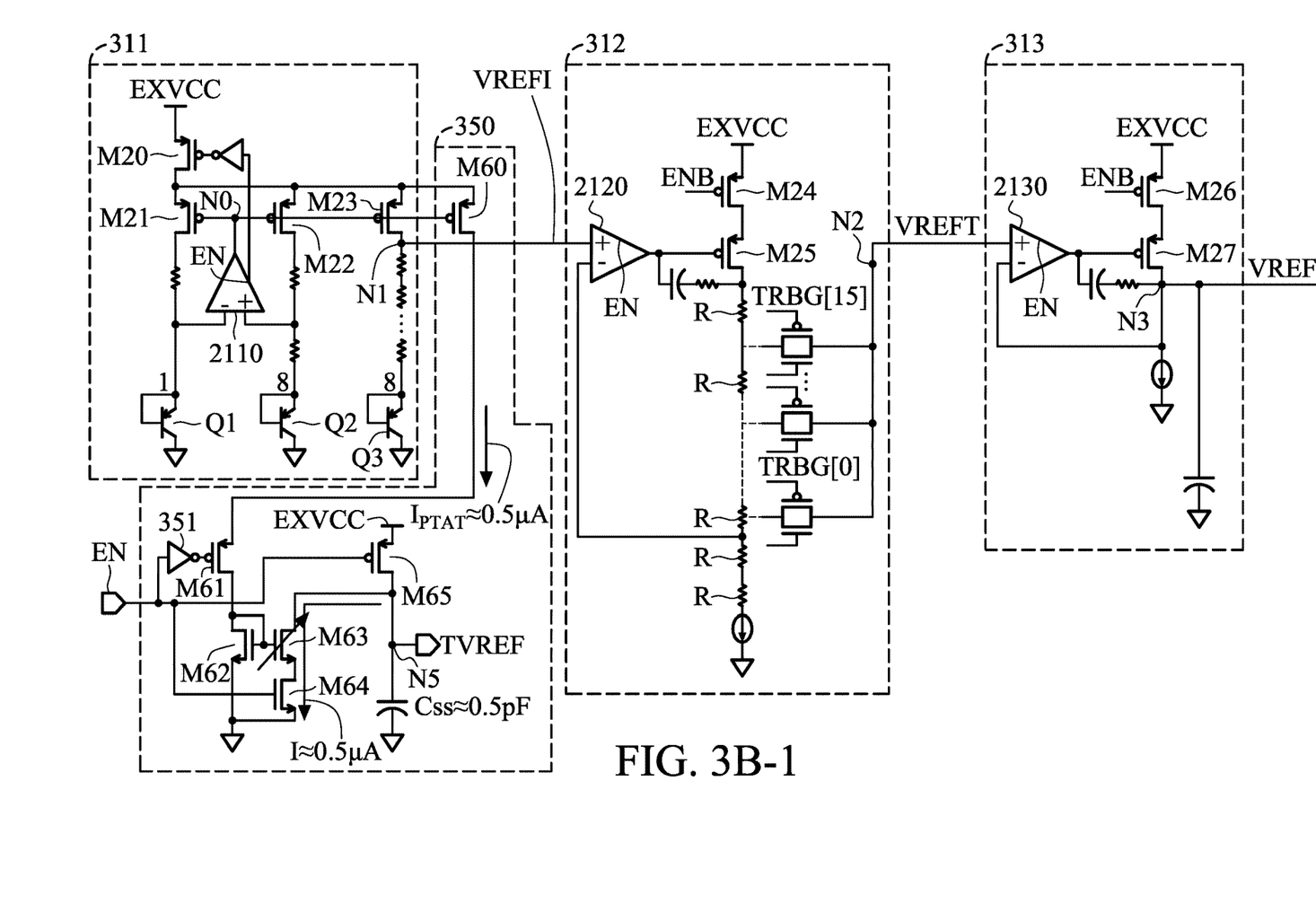

FIG. 3A is a block diagram of the clock-generating circuit in accordance with another embodiment of FIG. 1. FIGS. 3B-1 and 3B-2 are portions of a schematic diagram of the clock-generating circuit in accordance with an embodiment of FIG. 3A. Please refer to FIG. 1, FIG. 3A, and FIGS. 3B-1 and 3B-2.

In an embodiment, the clock-generating circuit 10 in FIG. 1 may be implemented by the clock-generating circuit 300 in FIG. 3A. As shown in FIG. 3A, the clock-generating circuit 300 may include a voltage-reference circuit 310, a voltage regulator 320, an oscillation generator 330, a level shifter 340, a tracking-voltage-generating circuit 350, and a switch circuit 360. The difference between the clock-generating circuit 300 in FIG. 3A and the clock-generating circuit 200 in FIG. 2A is that the clock-generating circuit 300 further includes the tracking-voltage-generating circuit 350 and the switch circuit 360, and the voltage regulator 320 is different from the voltage regulator 220 in FIG. 2A. The voltage-reference circuit 310 (e.g., including the reference-voltage-generating circuit 311, voltage-trimming circuit 312, and voltage buffer circuit 313), oscillation generator 330, and level shifter 340 are similar to the voltage-reference circuit 210, oscillation generator 230, and level shifter 240 in FIG. 2A, and the details of their operations can be referred to the embodiment of FIG. 2A, and will not be repeated here.

For example, the switch circuit 360 may be implemented by a P-type transistor M1, and the gate (i.e., control terminal), drain, and source of the P-type transistor M1 are respectively coupled to the enable signal EN, external voltage EXVCC, and the oscillation power-supply voltage VDDOSC.

When the clock-generating circuit 300 is in the standby state, the enable signal EN is in the low-logic state, wherein the voltage-reference circuit 310, voltage regulator 320, oscillation generator 330, and tracking-voltage-generating circuit 350 does not have any power consumption in the standby state. At this time, the P-type transistor M1 is turned on, and thus the oscillation power-supply voltage VDDOSC at the output terminal of the voltage regulator 320 is pulled up to the external voltage EXVCC. When the enable signal EN is switch from the low-logic state to the high-logic state, the P-type transistor M1 is turned off. At this time, the clock-generating circuit 300 is switched to the working state, and the voltage-reference circuit 310, voltage regulator 320, oscillation generator 330, and tracking-voltage-generating circuit 350 are enabled at the same time. After the tracking-voltage-generating circuit 350 is enabled, the tracking-voltage-generating circuit 350 may provide a temporary reference voltage TVREF to the voltage regulator 320.

For example, at the time point when the enable signal EN is switched from the low-logic state to the high-logic state, the temporary reference voltage TVREF generated by the tracking-voltage-generating circuit 350 is equal to the external voltage EXVCC. The temporary reference voltage TVREF generated by the tracking-voltage-generating circuit 350 will gradually drop from the external voltage EXVCC to 0V, and the falling slope of the temporary reference voltage TVREF can be adjusted through different voltage-trimming methods.

Specifically, the tracking-voltage-generating circuit 350, for example, may include transistors M60-M65, an inverter 351, and a capacitor Css, wherein the gate of the transistor M60 is controlled by the voltage at the output terminal (i.e., node N0) of the operational amplifier 2110 of the reference-voltage-generating circuit 311. When the voltage at node N0 is in the high-logic state or the enable signal EN is in the low-logic state, the transistors M60-M64 are turned off. At this time, the transistor M65 is turned on, so that the external voltage EXVCC charges the capacitor Css until the temporary reference voltage TVREF is equal to the external voltage EXVCC.

When the enable signal EN is in the high-logic state and a proper bias voltage is generated at node N0, the transistor M61 is turned on to provide a PTAT (proportional to absolute temperature) current IPTAT to the current mirror formed by the transistors M62-M64. Thus, the current flowing through the transistors M63 and M64 can discharge the capacitor Css until the voltage at node N5 is equal to the ground voltage (e.g., 0V), wherein the current I flowing through the transistors M63 and M64 is approximately 0.5 μA, and the capacitor Css is approximately 2.4 pF, but the invention is not limited thereto. The relationship between the voltage V, current I, capacitor Css, and time t can be expressed by equation (1) as follows:

$$Css*dV=I*dt \qquad (1)$$

For example, the current mirror has a slope-trimming design, which can adjust the falling speed of the temporary reference voltage TVREF at the output terminal (i.e., node N5) of the tracking-voltage-generating circuit 350. For example, the width/length (W/L) ratio of the transistor M63 can be adjusted to adjust the current flowing through the transistors M63 and M64, so as to adjust the falling speed of the temporary reference voltage TVREF at node N5.

Figure 3B:
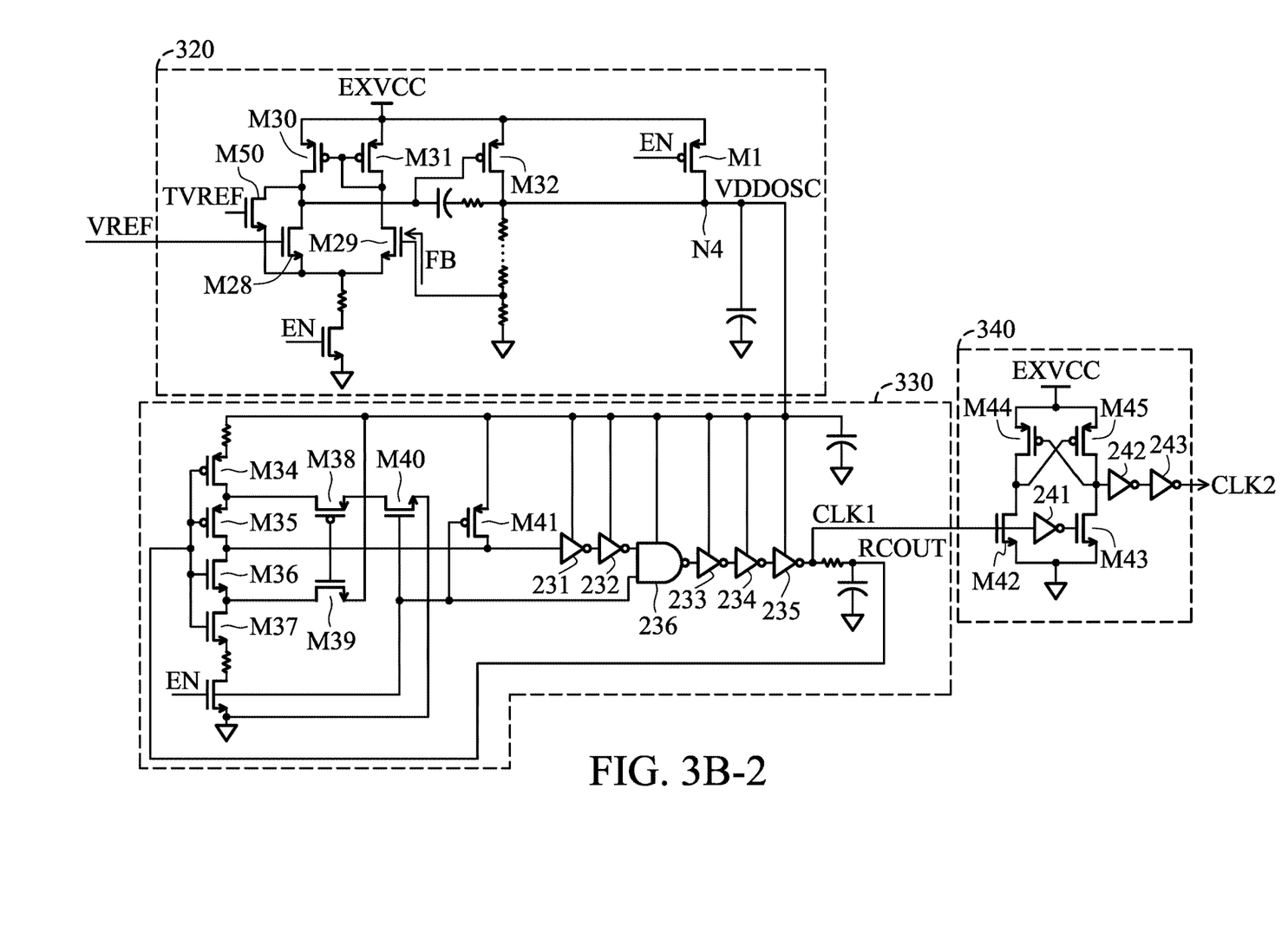

Compared with the voltage regulator 220 in FIG. 2B-2, the voltage regulator 320 in FIG. 3B-2 additionally adds the transistor M50 and the P-type transistor M1, and the temporary reference voltage TVREF generated by the tracking-voltage-generating circuit 350 is provided to the gate of the transistor M50. It should be noted that, the transistors M28-M29 and M50 in the voltage regulator 320 form a differential-pair circuit, and the left side (e.g., a first side) of the differential-pair circuit has two inputs, namely, the reference voltage VREF and the temporary reference voltage TVREF. When the enable signal EN is in the high-logic state and the temporary reference voltage TVREF is greater than or equal to the reference VREF, the voltage regulator 320 selects the temporary reference voltage TVREF as the input voltage on the left side of the differential-pair circuit (i.e., the input voltage on the right side of the differential-pair circuit is the feedback voltage FB). At this time, the feedback path of the voltage regulator 320 allows the P-type transistor M32 to keep a turn-on state. Thus, the oscillation power-supply voltage VDDOSC generated by the voltage regulator 320 is maintained at the external voltage EXVCC, and then gradually decreases with the falling slope of the temporary reference voltage TVREF.

When the enable signal EN is in the high-logic state and the temporary reference voltage TVREF is lower than the reference voltage VREF, the input voltage on the left side of the differential-pair circuit of the voltage regulator 320 is determined by the reference voltage VREF. At this time, a stable bias voltage is generated at the gate of the P-type transistor M32 through the feedback path, and it allows the P-type transistor M32 to be maintained in the turn-on state, and thus the voltage regulator 320 can generate the corresponding oscillation power-supply voltage VDDOSC at its output terminal. At this time, the voltage level of the oscillation power-supply voltage VDDOSC output by the voltage regulator 320 is sufficient for the oscillation generator 330 to generate the clock signal CLK1 with a frequency that meets the design requirements. It should be noted that when the voltage-reference circuit 310, voltage regulator 320, and tracking-voltage-generating circuit 350 are enabled to enter the working state, the temporary reference voltage TVREF generated by the tracking-voltage-generating circuit 350 gradually decreases from the external voltage EXVCC, and the reference voltage VREF generated by the voltage-reference circuit 310 gradually increases from 0V.

In other words, no matter whether the input voltage provided to the voltage regulator 30 is the temporary reference voltage TVREF or the reference voltage VREF, the input voltage can be maintained above a certain voltage level, so the oscillation power-supply voltage VDDOSC generated by the voltage regulator 320 can be smoothly changed from the external voltage EXVCC to the output voltage with a sufficient voltage level. Accordingly, the period variation of the clock signal CLK1 generated by the oscillation generator 330 is smaller, and the clock frequency required by the system can be reached more quickly, so that the data read transfer time tRD of the flash memory 30 can meet the design specifications.

Figure 4A:
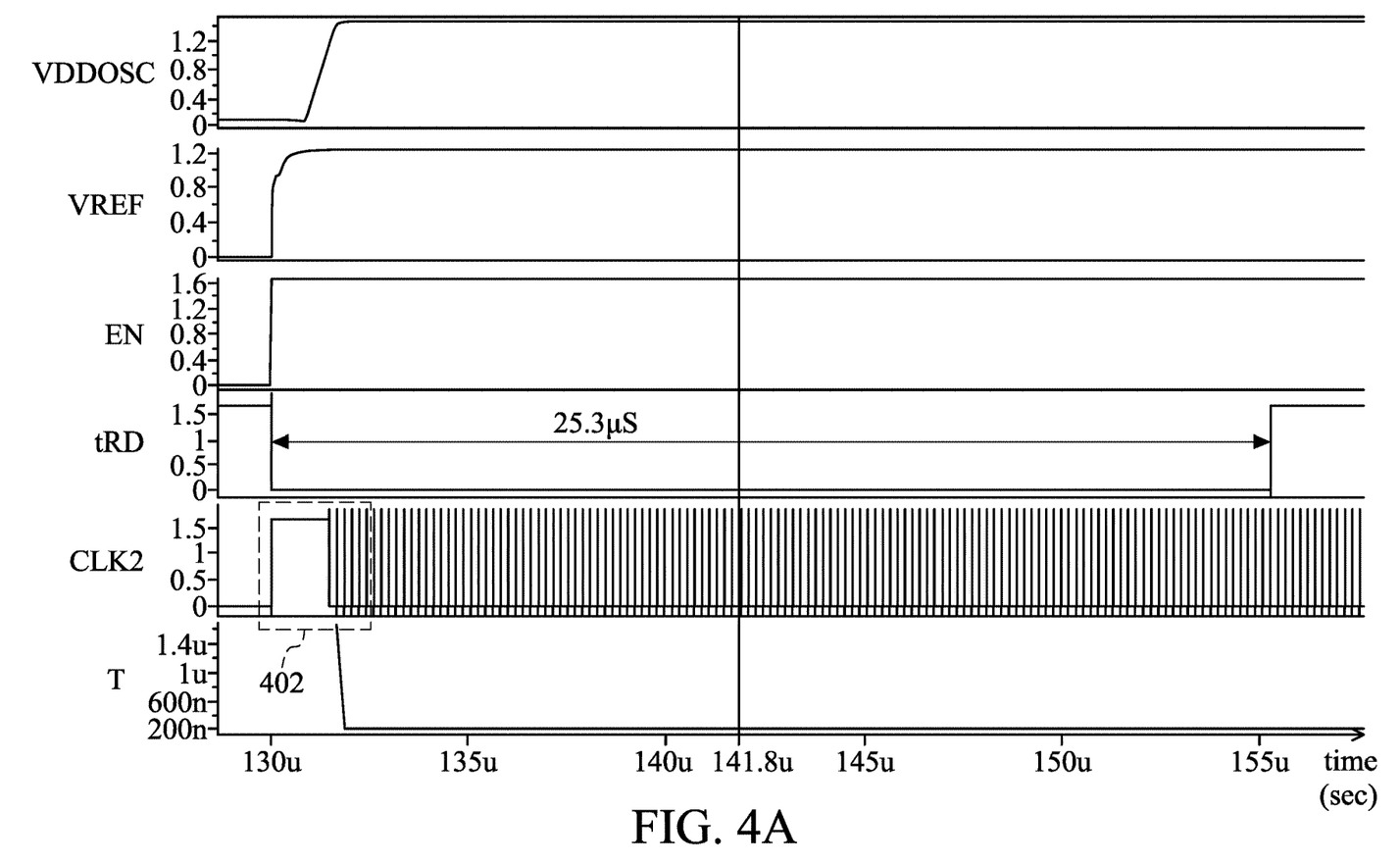
FIG. 4A is a waveform diagram of each signal of the clock-generating circuit in accordance with the embodiment of FIG. 2A.
Figure 4B:
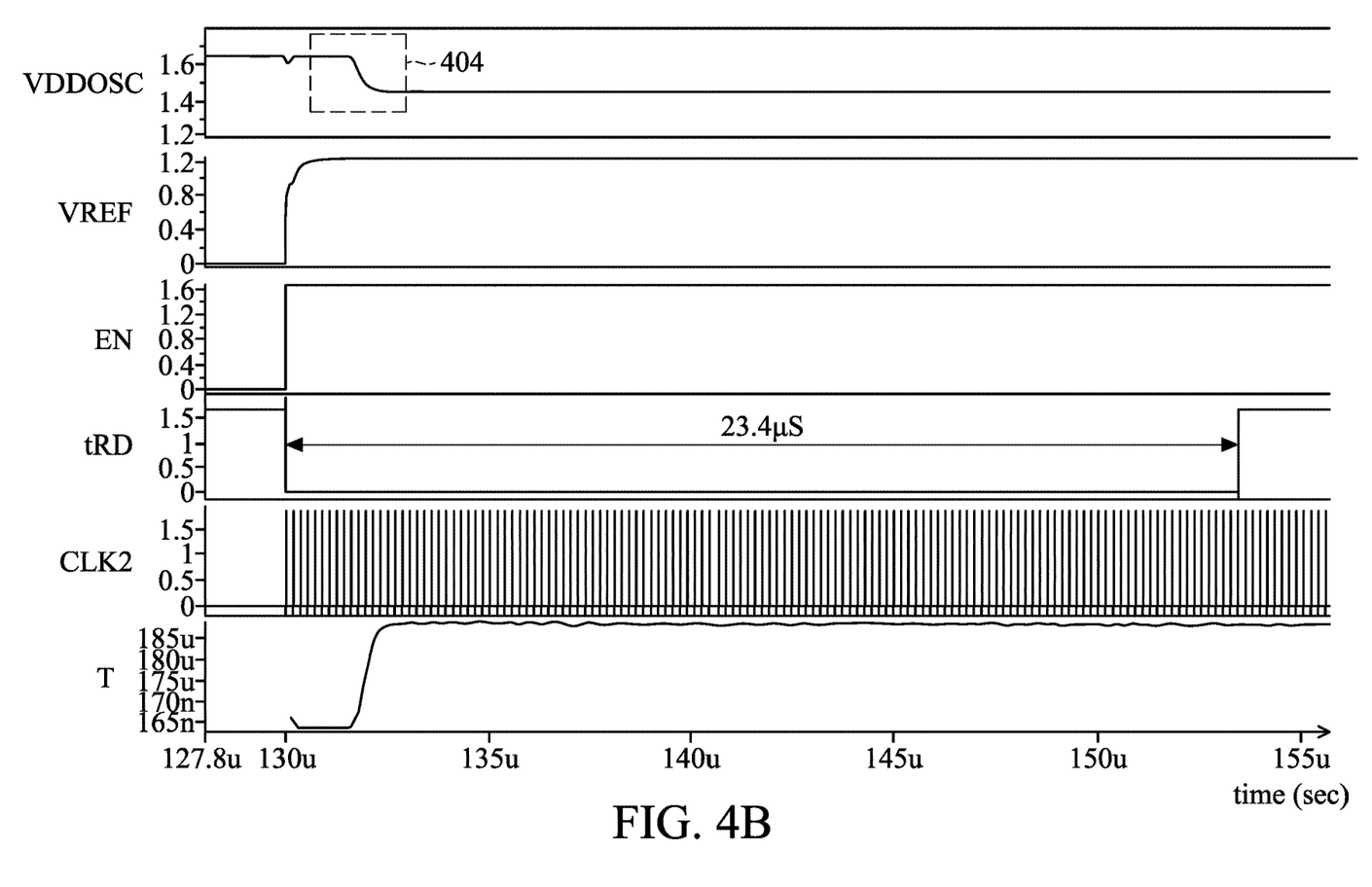
FIG. 4B is a waveform diagram of each signal of the clock-generating circuit in accordance with the embodiment of FIG. 3A.

FIG. 4A is a waveform diagram of each signal of the clock-generating circuit in accordance with the embodiment of FIG. 2A. FIG. 4B is a waveform diagram of each signal of the clock-generating circuit in accordance with the embodiment of FIG. 3A.

Please refer to FIG. 1, FIG. 2A, and FIG. 4A, when the enable signal EN of the clock-generating circuit 200 is switched from the low-logic state to the high-logic state, the voltage-reference circuit 210, the voltage regulator 220, and the oscillation generator 230 synchronously enter the working state from the standby state. At this time, the reference voltage VREF generated by the voltage-reference circuit 210 also starts from 0V and gradually increases to the preset reference voltage, and the oscillation power-supply voltage VDDOSC generated by the voltage regulator 220 starts from 0V and gradually increases to the preset voltage, as shown in FIG. 4A.

When the enable signal EN is switched from the low-logic state to the high-logic state, the memory controller 20 starts to calculate the data read transfer time tRD of the flash memory 30, and the data read transfer time tRD generally needs a fixed number of clock cycles to successfully read back data from the flash memory 30. However, since the oscillation power-supply voltage VDDOSC generated by the voltage regulator 220 gradually increases from 0V to the preset voltage, the frequency of the clock signal CLK1 generated by the oscillation generator 230 is also very low (i.e., the clock period T is very long, as shown in area 402), which will cause the overall time of the aforementioned fixed number of clock cycles to be prolonged. This will also increase the data read transfer time tRD of the flash memory 30, so that the data read transfer time tRD may not meet the design specifications.

For example, it is assumed the design specifications of the data read transfer time tRD of the flash memory 30 is 25 μs, but the data read transfer time tRD in FIG. 4A is as high as 25.3 μs. Therefore, the memory controller 20 monitors the data signal on the bus during the period specified by the design specifications. For example, the memory controller 20 may perform a read operation on the flash memory 30, and the memory controller 20 may calculate the period within 25 μs from the time point when the enable signal EN is switched to the high-logic state. If the memory controller 20 does not receive the data signal responded from the flash memory 30 within this period, the memory controller 20 will determine that the read operation has failed.

In other words, both the voltage-reference circuit 210 and the voltage regulator 220 require a certain startup time to make the clock signal CLK2 output by the clock-generating circuit 200 operate normally. However, the rising speed of the oscillation power-supply voltage VDDOSC generated by the voltage regulator 220 is relatively slower than that of the reference voltage VREF generated by the voltage-reference circuit 210, so that the frequency of the clock signal CLK1 generated by the oscillation generator 230 varies significantly. It may cause the data read transfer time tRD of the flash memory 30 not to meet the design specifications, and the oscillation power-supply voltage VDDOSC may have voltage dip and stability problems.

Please refer to FIG. 1, FIG. 3A, FIG. 3B-2, and FIG. 4B, when the enable signal EN in the clock-generating circuit 300 is switched from the low-logic state to the high-logic state, the voltage-reference circuit 310, the voltage regulator 320, and the oscillation generator 330 are synchronously switched to the working state from the standby mode. When the temporary reference voltage TVREF is higher than or equal to the reference voltage VREF, the left-side input voltage of the differential-pair circuit in the voltage regulator 320 is determined by the temporary reference voltage TVREF. At this time, the feedback path of the voltage regulator 320 allow the P-type transistor M32 to be maintained at the turn-on state, and thus oscillation power-supply voltage VDDOSC generated by the voltage regulator 320 will be kept at the external voltage EXVCC, and then it gradually decreases with the falling slope of the temporary reference voltage TVREF.

When the temporary voltage TVREF is lower than the reference voltage VREF, the left-side input voltage of the differential-pair circuit of the voltage regulator 320 is determined by the reference voltage VREF, and the voltage regulator 320 may generate the corresponding oscillation power-supply voltage at its output terminal. It should be noted that, when the voltage-reference circuit 310, the voltage regulator 320, and the tracking-voltage-generating circuit 350 are enabled to enter the working state, the temporary reference voltage TVREF generated by the tracking-voltage-generating circuit 350 gradually decreases from the external voltage EXVCC, and the reference voltage VREF generated by the voltage-reference circuit 310 gradually increases from 0V.

In other words, no matter whether the input voltage provided to the voltage regulator 320 is the temporary reference voltage TVREF or the reference voltage VREF, the input voltage can be maintained above a certain voltage level, and thus the oscillation power-supply voltage VDDOSC generated by the voltage regulator 320 can be smoothly changed from the external voltage EXVCC to the output voltage with a sufficient voltage level. As shown in area 404 in FIG. 4B, the oscillation power-supply voltage VDDOSC can be smoothly switched from 1.65V to 1.45V.

Similarly, when the enable signal EN is switched from the low-logic state to the high-logic state, the memory controller 20 starts to calculate the data read transfer time tRD of the flash memory 30, and the data read transfer time tRD generally needs a fixed number of clock cycles to successfully read back data from the flash memory 30. Since the oscillation power-supply voltage VDDOSC generated by the voltage regulator 320 can be maintained above a certain voltage level, the frequency of the clock signal CLK1 generated by the oscillation generator 330 can reach the preset operating frequency quickly, and the overall time of the fixed number of clock cycles can be reduced, that is, the data read transfer time tRD of the flash memory 30 can be reduced to meet the design specifications. Accordingly, the period variation of the clock signal CLK1 generated by the oscillation generator 330 is smaller, and the clock frequency required by the system can be reached more quickly, so that the data read transfer time tRD of the flash memory 30 can meet the design specifications.

For example, it is assumed the design specifications for the data read transfer time tRD of the flash memory 30 is 25 μs, but the data read transfer time tRD in FIG. 4B is only 23.4 μs. Therefore, the memory controller 20 can receive the data signal responded from the flash memory 30 within the period defined by the design specifications.

In view of the above, a clock-generating circuit is provided, which may use the design of a tracking-voltage generator to provide a temporary reference voltage with a higher voltage level to the voltage regulator while the clock-generating circuit enters the working state from the standby state. In addition, using the design of the switch circuit, the voltage regulator may provide the oscillation power-supply voltage with a sufficient voltage level to the oscillation generator to quickly generate a more stable clock signal with smaller frequency variation to meet the design specifications.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A clock-generating circuit, comprising:
    a voltage-reference circuit, converting an external voltage into a reference voltage;
    a tracking-voltage-generating circuit, converting the external voltage into a temporary reference voltage;
    a voltage regulator, receiving the reference voltage and the temporary reference voltage, and converting the reference voltage or the temporary reference voltage to an oscillation power-supply voltage;
    an oscillation generator, generating a first clock signal according to the oscillation power-supply voltage; and
    a level shifter, converting a voltage amplitude of the first clock signal to generate a second clock signal output by the clock-generating circuit,
    wherein the voltage regulator comprises a switch circuit for controlling whether to pull up the oscillation power-supply voltage, which is at an output terminal of the voltage regulator, to the external voltage according to an enable signal.

2. The clock-generating circuit as claimed in claim 1, wherein the switch circuit is a first P-type transistor, which comprises a gate, a source, and a drain respectively connected to the enable signal, the external voltage, and the output terminal of the voltage regulator.

3. The clock-generating circuit as claimed in claim 2, wherein the voltage-reference circuit, the tracking-voltage-generating circuit, the voltage regulator, and the oscillation generator are controlled by the enable signal,
    wherein when the enable signal is in a low-logic state, the voltage-reference circuit, the tracking-voltage-generating circuit, the voltage regulator, and the oscillation generator are in a standby state,
    wherein when the enable signal is in a high-logic state, the voltage-reference circuit, the tracking-voltage-generating circuit, the voltage regulator, and the oscillation generator are in a working state.

4. The clock-generating circuit as claimed in claim 3, wherein when the enable signal is switched to the high-logic state from the low-logic state, the first P-type transistor is turned off, and the temporary reference voltage generated by the tracking-voltage-generating circuit gradually deceases to a ground voltage, and the reference voltage generated by the voltage-reference circuit gradually increases to a predetermined voltage from the ground voltage.

5. The clock-generating circuit as claimed in claim 4, wherein the voltage regulator comprises a differential-pair circuit, and an input of a first side of the differential-pair circuit comprises the reference voltage and the temporary reference voltage, and an input of a second side of the differential-pair circuit is a feedback voltage obtained from the oscillation power-supply voltage output by the voltage regulator through a feedback path.

6. The clock-generating circuit as claimed in claim 5, wherein the first side of the differential-pair circuit comprises a first transistor and a second transistor connected in parallel, and the reference voltage is provided to a gate of the first transistor, and the temporary reference voltage is provided to a gate of the second transistor.

7. The clock-generating circuit as claimed in claim 5, wherein when the enable signal is in the high-logic state and the temporary reference voltage is higher than or equal to the reference voltage, the input of the first side of the differential-pair circuit is determined by the temporary reference voltage,
    wherein when the enable signal is in the high-logic state and the temporary reference voltage is lower than the reference voltage, the input of the first side of the differential-pair circuit is determined by the reference voltage.

8. The clock-generating circuit as claimed in claim 5, wherein the voltage regulator further comprises a second P-type transistor, wherein a gate and a drain of the second P-type transistor is connected to the output terminal of the voltage regulator, and a source of the second P-type transistor is connected to the external voltage, wherein when the enable signal is in the high-logic state and the temporary reference voltage is higher than or equal to the reference voltage, the feedback path allows the second P-type transistor to be turned on, so that the oscillation power-supply voltage at the output terminal of the voltage regulator is maintained at the external voltage, and then gradually decreases with a falling slope of the temporary reference voltage, wherein when the enable signal is in the high-logic state and the temporary reference voltage is lower than the reference voltage, a gate of the second P-type transistor generates a stable bias voltage via the feedback path to allow the second P-type transistor to be turned on, and the output terminal of the voltage regulator generates the oscillation power-supply voltage correspondingly.

9. The clock-generating circuit as claimed in claim 4, wherein the tracking-voltage-generating circuit comprises a third P-type transistor, a current mirror, and a capacitor, and a gate, a source, and a drain of the third P-type transistor are respectively connected to the enable signal, the external voltage, and an output terminal of the tracking-voltage-generating circuit, and a first terminal and a second terminal of the capacitor are respectively connected to the output terminal of the tracking-voltage-generating terminal and the ground voltage.

10. The clock-generating circuit as claimed in claim 9, wherein when the enable signal is in the low-logic state, the third P-type transistor is turned on to charge the capacitor with the external voltage until the temporary reference voltage is equal to the external voltage, wherein when the enable signal is switched from the low-logic state to the high-logic state, the third P-type transistor is turned off, and the current mirror discharges the capacitor with a first current until the temporary reference voltage is equal to the ground voltage.

11. The clock-generating circuit as claimed in claim 10, wherein the current mirror has a slope-trimming function to adjust the first current.

12. The clock-generating circuit as claimed in claim 3, wherein the second clock signal is provided to a memory controller and a flash memory which are coupled to each other through a bus, wherein when the memory controller executes a read operation of the flash memory, the memory controller switches the enable signal from the low-logic state to the high-logic state, and starts counting a number of clock cycles elapsed by the second clock signal until the memory controller receives a data signal responded by the flash memory for the read operation, wherein when a period obtained by multiplying a clock period of the second clock signal by the number of clock cycles is greater than a predetermined period, the memory controller determines that the read operation has failed, wherein when the period obtained by multiplying the clock period of the second clock signal by the number of clock cycles is smaller than or equal to the predetermined period, the memory controller determines that the read operation has succeeded.

13. The clock-generating circuit as claimed in claim 2, wherein when the enable signal is in a low-logic state, the first P-type transistor is turned on, and the oscillation power-supply voltage at the output terminal of the voltage regulator is pulled up to the external voltage.

* * * * *